US006975950B2

(12) United States Patent
Bardsley (10) Patent No.: US 6,975,950 B2
(45) Date of Patent: Dec. 13, 2005

(54) VARIABLE RESOLUTION DIGITAL CALIBRATION (75) Inventor: Scott G. Bardsley, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 26 days.

(21) Appl. No.: 10/740,380

(22) Filed: Dec. 18, 2003

(65) Prior Publication Data

US 2005/0137817 A1 Jun. 23, 2005

(51) Int. Cl.[7] .............................................. G06F 19/00
(52) U.S. Cl. ..................................... 702/106; 702/189
(58) Field of Search ........................... 73/1.01, 1.34, 73/1.3; 324/74, 76.11, 130, 601; 341/108, 341/118, 120; 702/85, 107, 183, 104, 105, 702/106, 182, 188, 189, FOR 156, FOR 172

(56) References Cited

U.S. PATENT DOCUMENTS

| | | | | |
|---|---|---|---|---|
| 4,970,514 A | * | 11/1990 | Draxelmayr | 341/120 |
| 5,929,796 A | * | 7/1999 | Opris et al. | 341/120 |
| 6,151,238 A | * | 11/2000 | Smit et al. | 365/96 |
| 6,720,895 B2 | * | 4/2004 | Poulton et al. | 341/120 |
| 6,748,344 B2 | * | 6/2004 | Mendoza et al. | 702/189 |
| 6,801,042 B2 | * | 10/2004 | Mc Pherson et al. | 324/601 |
| 6,894,631 B1 | * | 5/2005 | Bardsley | 341/120 |

OTHER PUBLICATIONS

"A 15 b 1 Ms/s digitally self-calibrated pipeline ADC"; Karanicolas, A.N.; Lee, H.S.; Bacrania, K.L.;□□Solid-State Circuits Conference, 1993. Digest of Technical Papers. 40th ISSCC., 1993 IEEE International; Feb. 24-26, 1993 Page(s):60-61, 263.*
"Monolithic low-power 16 b 1 MSample/s self-calibrating pipeline ADC"; Mayes, M.K.; Chin, S.W.;□□Solid-State Circuits Conference, 1996. Digest of Technical Papers. 43rd ISSCC., 1996 IEEE International; Feb. 8-10, 1996 Page(s): 312-313, 465.*
"A 200 mW, 1 Msample/s, 16-b pipelined A/D converter with on-chip 32-b microcontroller"; Mayes, M.K.; Sing W. Chin;□□Solid-State Circuits, IEEE Journal of ; vol. 31, Issue 12, Dec. 1996 Page(s):1862-1872.*

(Continued)

Primary Examiner—Michael Nghiem
Assistant Examiner—Douglas N Washburn
(74) Attorney, Agent, or Firm—Wolf, Greenfield & Sacks, P.C.

(57) ABSTRACT

Methods and apparatus for calibrating one or more signals of an electronic device are provided. Calibration coefficients are stored in a memory, such as a fuse bank, to be applied to correct the one or more signals. A selection multiplexer is provided, the selection multiplexer capable of assigning one of a number of bit weight configurations to the calibration coefficients to set a desired range and resolution for calibration information applied to the one or more signals of the electronic device.

34 Claims, 8 Drawing Sheets

OTHER PUBLICATIONS

"A single-ended 12-bit 20 Msample/s self-calibrating pipeline A/D converter"; Opris, I.E.; Lewicki, L.D.; Wong, B.C.;□□Solid-State Circuits, IEEE Journal of; vol. 33, Issue 12, Dec. 1998 Page(s):1898-1903.*

"A programmable sensor signal conditioning LSI"; Murabayashi, F.; Matsumoto, M.; Hanzawa, K.; Yamauchi, T.; Sakurai, K.; Yamada, H.; Shimada, S.; Miyazaki, A.; AP-ASIC Proceedings Second IEEE Asia Pacific Conference on; Aug. 28-30, . 2000 Page(s):107-110.*

"A digital calibration technique for pipelined analog-to-digital converters"; Furuta, M.; Kawahito, S.; Miyazaki, D.; Instrumentation and Measurement Technology Conference. IMTC/2002. Proceedings of the 19th IEEE; vol. 1, May 21-23, 2002 Page(s):713-717.*

"A digital self-calibration method for pipeline A/D converters"; Sumanen, L.; Waltari, M.; Korhonen, T.; Halonen, K.; Circuits and Systems, 2002. ISCAS 2002. IEEE International Symposium on; vol. 2, May 26-29, 2002 Page(s):II-792-II-795.*

* cited by examiner

| INPUT FROM FUSE | BIT WEIGHT | CAL. INFO | S=11 | S=00 | S=01 | S=10 |
|---|---|---|---|---|---|---|
| - | 4 | O<6> | I<3> | I<3> | I<3> | I<3> |
| I<3> | 2 | O<5> | I<2> | I<3> | I<3> | I<3> |
| I<2> | 1 | O<4> | I<1> | I<2> | I<3> | I<3> |
| I<1> | 1/2 | O<3> | I<0> | I<1> | I<2> | I<3> |
| I<0> | 1/4 | O<2> | 0 | I<0> | I<1> | I<2> |
| - | 1/8 | O<1> | 0 | 0 | I<0> | I<1> |
| - | 1/16 | O<0> | 0 | 0 | 0 | I<0> |

| INPUT FROM FUSE | BIT WEIGHT | CAL. INFO | S=11 | S=00 | S=01 | S=10 |
|---|---|---|---|---|---|---|
| - | 16 | O<8> | I<5> | I<5> | I<5> | I<5> |
| I<5> | 8 | O<7> | I<4> | I<5> | I<5> | I<5> |
| I<4> | 4 | O<6> | I<3> | I<4> | I<5> | I<5> |
| I<3> | 2 | O<5> | I<2> | I<3> | I<4> | I<5> |
| I<2> | 1 | O<4> | I<1> | I<2> | I<3> | I<4> |
| I<1> | 1/2 | O<3> | I<0> | I<1> | I<2> | I<3> |
| I<0> | 1/4 | O<2> | 0 | I<0> | I<1> | I<2> |
| - | 1/8 | O<1> | 0 | 0 | I<0> | I<1> |
| - | 1/16 | O<0> | 0 | 0 | 0 | I<0> |

| CODE | CALIBRATION BITS |
|------|------------------|
| 111  | 001010           |
| 110  | 110010           |
| 101  | 101101           |
| 100  | 000000           |
| 011  | 011000           |
| 010  | 010111           |
| 001  | 000000           |
| 000  | 000000           |

FIG. 8

VARIABLE RESOLUTION DIGITAL CALIBRATION

FIELD OF THE INVENTION

The present invention relates generally to calibrating analog and/or digital components and, more particularly to calibrating an analog-to-digital converter (ADC) such as, for example, a multi-stage or pipeline ADC.

BACKGROUND OF THE INVENTION

Electronic devices that rely on the close matching of electronic components (e.g., resistors, capacitors, etc.) or precision in one or more signals provided by an electronic component may be vulnerable to errors caused by tolerances inherent in the manufacture of the components. Calibration is often performed on a device to reduce or eliminate these errors. The term "calibrate" refers generally to any modification to a signal and/or electronic component to provide correction and/or compensation. For example, calibration may include adjusting one or more signals to correct for component mismatch errors.

Analog-to-digital converters (ADC), for example, often employ one or more sample and hold circuits that rely on matched capacitors to accurately determine the level or value of an analog input signal. The precision of an ADC may depend on capacitors that exhibit essentially identical operating characteristics. However, variability in manufacturing processes of the capacitors may produce slightly different properties and characteristics. Such imperfectly matched components may provide one or more signals having errors in proportion to the mismatch. Moreover, various electronic devices may rely on precise voltages, currents or comparisons thereof provided by electronic components that vary with process, temperature, frequency, power supply, etc. To achieve a desired device performance, one or more of these errors may require correction by calibrating one or more signals of the device.

Calibrating an electronic device may be achieved by correcting signals generated by one or more digital or analog components in the device. For example, calibration values may be stored in a device and referenced during operation of the device to correct for errors in signals provided by or operated on by the device. A memory may be provided to store calibration bits (also referred to as calibration coefficients) that are added, subtracted or otherwise employed to adjust the value of one or more signals. Calibration bits may be stored via a plurality of fuses that are selectively blown to store, for example, a value of 0 when disconnected (i.e., open circuit condition) and a value of 1 when fused (i.e., short circuit condition). A plurality of fuses may be employed to represent a desired number, value or code that can be used to calibrate one or more signals of a device. Alternatively, any other type of memory device may be used to store calibration bits.

The greater the number of fuses arranged to store a calibration value, or the greater the word length of a calibration coefficient stored in other types of memory, the more precisely a signal may be calibrated. However, increasing the number of fuses (and/or increasing the size of the memory) increases the size of the device, for example, by increasing the die area of an integrated circuit. In addition, the larger the memory, the more power the device consumes. For example, each fuse requires additional power consumption to test whether the fuse has been blown or not (i.e., to test whether a respective fuse stores a 0 value or a 1 value).

As a result, there is often a tradeoff between die area and power consumption, and the resolution at which a device may be calibrated.

SUMMARY OF THE INVENTION

One embodiment according to the present invention includes a method of calibrating at least one signal of an electronic device, the method comprising acts of providing a plurality of calibration bits, selectively assigning one of a plurality of bit weight configurations to the plurality of calibration bits to provide calibration information having a selected resolution, and applying the calibration information to the at least one signal to provide at least one calibrated signal.

Another embodiment according to the present invention includes an apparatus for calibrating at least one signal of an electronic device. The apparatus comprises at least one register capable of storing a plurality of bits, a selection component coupled to the register and receiving at least one control signal, the selection component configured to assign one of a plurality of bit weight configurations to the plurality of bits of the at least one register based on the at least one control signal to generate calibration information from the plurality of bits, and a correction component coupled to the selection component to receive the calibration information, the correction component adapted to adjust the at least one signal based on the calibration information to provide at least one calibrated signal.

Another embodiment according to the present invention includes an apparatus for calibrating at least one signal of an electronic device. The apparatus comprises at least one register capable of storing a plurality of calibration coefficients indicating calibration information for the at least one signal, means for selecting a resolution of the calibration information after the electronic device has been manufactured, and a correction component arranged to receive the calibration information and apply the calibration information to the at least one signal.

DETAILED DESCRIPTION

Many digital and/or analog devices operate by generating, responding to and/or operating on one or more signals. The signals within a device may be digital signals, analog signals or a combination of both. The performance of a device may depend in part on the accuracy or precision of the signals being generated, operated on or output by the device. As discussed above, there are numerous influences that may effect the accuracy of a signal. For example, component mismatch, component imprecision and/or various signal processing imprecision may effect the accuracy of one or more signals of an electronic device. Various calibration techniques have been employed to correct for these errors such that an electronic device operates with satisfactory accuracy and precision.

Errors in one or more signals of a device are often determined during part-by-part testing. For example, after an electronic device has been manufactured, testing equipment may be employed to determine the extent of calibration that the device requires. This is often achieved by providing a known input (e.g., one or more signals having a known value) to the manufactured device and measuring one or more signals generated by the device in response to the input. The measured signals may be compared with expected values to determine if and to what extent errors are present in the device. Once device errors have been quantified, one or more calibration values may then be determined that generally compensate and/or correct for the errors. For example, calibration values may be stored in memory and then added to or subtracted from one or more signals during operation of the device.

Calibration techniques may be implemented in either the digital or analog domain. Calibration in the analog domain may itself rely on component matching or precise component operation and may not optimally reduce errors in the operation of the device. Calibration in the digital domain may not suffer from these limitations. However, calibration in the digital domain may be vulnerable to imprecision due to the fact that calibration values may only be represented discretely. For example, to increase the range or resolution of a digital signal, an increased number of bits is typically required. However, increasing the number of bits stored on a device increases the size of the component and the amount of power consumed by the device during operation.

Figure 1A:
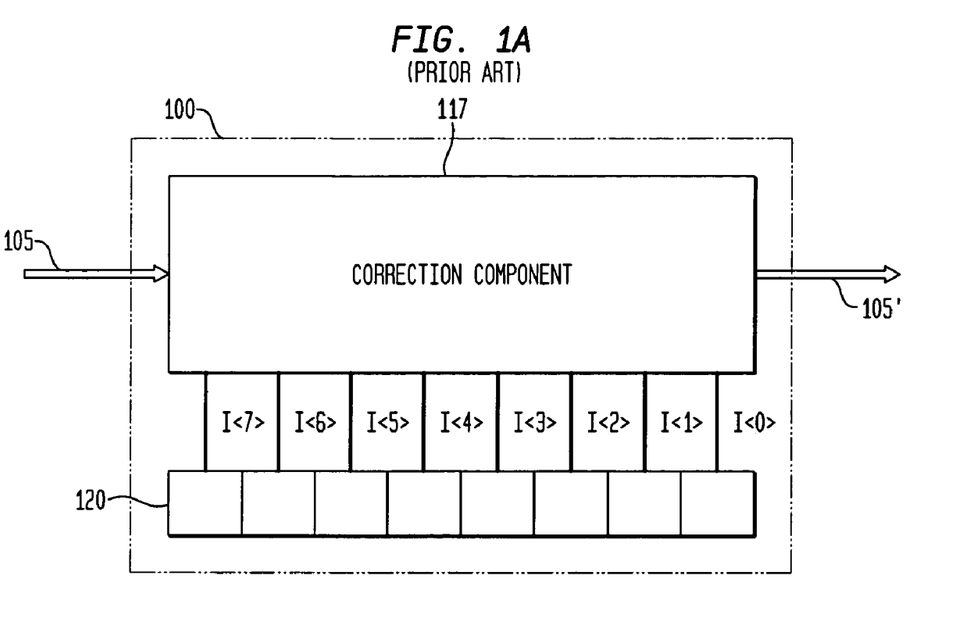
FIG. 1A illustrates a conventional calibration component for calibrating a signal of an electronic component or device.

FIG. 1 illustrates one example of conventional device calibration. Calibration component 100 receives an uncalibrated signal 105 as an input and provides a calibrated signal 105' as an output. Signal 105 may be any signal provided to and/or operated on by an electronic component or device. For example, signal 105 may be a digital signal converted from an analog signal as part of an ADC, or signal 105 may be an analog signal provided by an electronic component such as an operational amplifier, variable gain amplifier, differential amplifier, resistive ladder, capacitor array, etc. Signal 105 may carry an error due to, for example, component mismatch within the device. Accordingly, it may be desirable to correct for or reduce this error so that signal 105 carries more accurate information.

Calibration component 100 includes correction component 117 and register 120. Register 120 may be any component capable of storing one or more bits. For example, register 120 may be any of various memory devices capable of storing binary values. Register 120 may be a bank of fuses capable of being selectively blown to store a desired arrangement of bit values. Register 120 is typically non-volatile to retain calibration information in the absence of power. However, register 120 may be a volatile memory component capable of storing calibration information during operation that is received from elsewhere, for example, as bootstrap information when the device is powered up.

As discussed above, the number of bits in register 120 may effect the size and cost of the component. For example, if register 120 is a fuse bank, each fuse requires additional space and consumes additional power. Calibration component 100 may be only one of many calibration blocks in an electronic device adapted to compensate for errors in any number of signals that may be present in the device to achieve desired operation of the device. Accordingly, the number of bits employed to correct any given signal is often chosen in consideration of the relative importance of accuracy and/or precision of the signal compared with other signals that may require calibration, and in consideration of size and power consumption requirements of the device. As such, signals requiring calibration may be competing for a limited number of calibration bits.

Figure 1B:
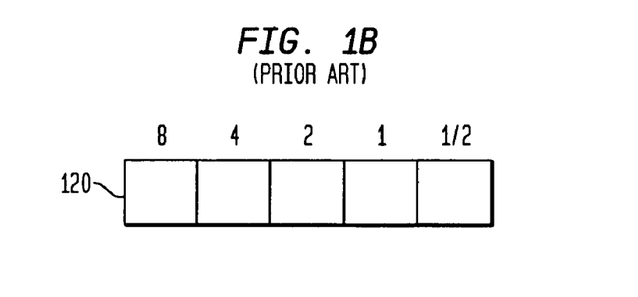
FIGS. 1B and 1C illustrate bit weights assigned at design time to the bits of the register of the calibration component.

In view of the generally limited number of calibration bits that may be provided on a device, the range and resolution determined by a given number of calibration bits must be determined. For example, each bit of register 120 may be assigned bit weights as shown in FIG. 1B. It is often desirable to be able to correct signals in both a positive and negative direction (i.e., to increase or decrease the value of a signal). Accordingly, the value stored by register 120 may have a twos complement representation. As such, the most significant bit may indicate a negative weight.

Figure 1C:
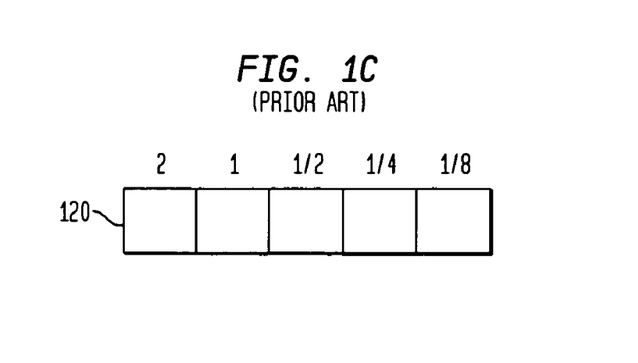

In FIG. 1B, register 120 is capable of representing two's complement values ranging from 7 to −8 at a resolution of ½. In FIG. 1C, register 120 is capable or representing two's complement values ranging from 1 to −2 at a resolution of ⅛. However, the magnitude of an error in signal 105 may be unknown until the electronic device has been manufactured, making the choice of appropriate range and resolution of register 120 difficult to choose. On the one hand, it is desirable to calibrate signal 105 at the greatest possible resolution, however, the register should have sufficient range to compensate for any error that may result.

For example, assume that after the device is manufactured and tested, the error in signal 105 is measured to be +1.125. If register 120 in FIG. 1A is assigned bit weights as shown in FIG. 1B, calibration component 100 will only be capable of providing either a calibration value of 1 or −1.5 due to its limited resolution. In addition, the two most significant bits will be essentially wasted. As such, the bit weights assigned to register 120 in FIG. 1C are more suitable since a calibration component so arranged can provide a −1.125 compensation that matches the measured error and provides superior correction. The error values and bit weights used herein are merely exemplary and are intentionally left without units. It should be appreciated that the units of calibration information will depend on the type of signal being calibrated. For example, the units of calibration information may be in volts, amps, LSBs, etc.

Assume instead that after the device is manufactured and tested, the error in signal 105 is determined to be 6.125. If register 120 in FIG. 1A is assigned bit weights as shown in FIG. 1C, calibration component 100 would have insufficient range to adequately correct for the measured error. In particular, at best, signal 105 would still carry an error of 4.125 even after the maximum calibration afforded by the available range has been applied. While bit weights assigned to register 120 as shown in FIG. 1B would still not achieve perfect calibration due to its limited resolution, it could reduce the error to 0.125. As such, the bit weights assigned to register 120 in FIG. 1B are more suitable in this situation.

However, it may not be known until the part has been manufactured what the error will be. Since the bit weights assigned to register 120 are conventionally assigned at design time (i.e., correction component 117 is designed to interpret each bit as having a particular weight), a designer must sacrifice either range or resolution to avoid adding additional calibration bits to the device. Without the benefit of knowing the actual magnitude of the error that will result after manufacture, calibration may not be optimally tailored to fit actual errors in the device because bit weights are fixed before manufacture. The inflexibility of convention calibration often results in a calibration component that is unable to provide sufficient range or satisfactory resolution.

Applicant has recognized that flexible calibration may be achieved by choosing the range or resolution of a calibration component after errors have been determined, for example, during testing of a component after manufacture. One embodiment according to the present invention includes providing selection circuitry capable of assigning bit weights to one or more registers at a time when actual errors present in the device have been measured. As such, a range and/or resolution of calibration information may be tailored to suit the actual needs of a device.

Figure 2A:
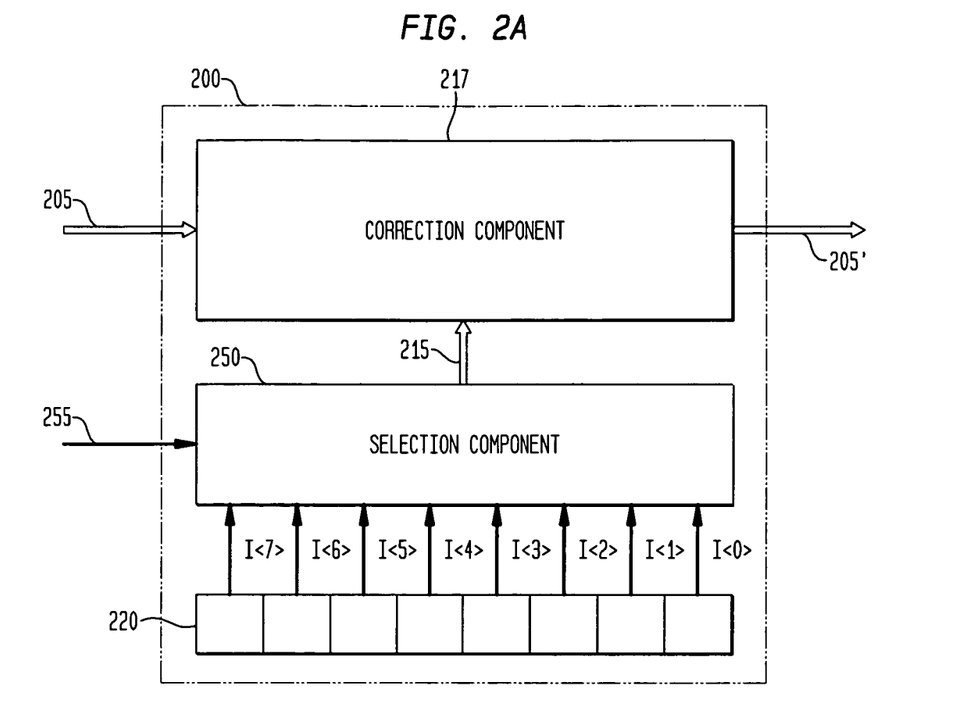
FIG. 2A illustrates one embodiment according to the present invention of a calibration component having a selection component adapted to selectively assign bit weights to the calibration bits of a register of the calibration component.

FIG. 2 illustrates one embodiment according to the present invention of a calibration component 200. Calibration component 200 includes selection component 250 coupled to a calibration register 220. The selection component may be capable of selecting amongst a plurality of bit weights to assign to the bits stored by calibration register 220. Calibration component 200 receives an input signal 205 and provides a calibrated signal 205'. Signal 205 may be any signal (digital or analog) for which calibration is desired. Calibration component 200 also may include a correction component 217. Correction component 217 may be coupled to selection component 250 to receive calibration information 215. Calibration information 215 may then be applied to signal 205 to, for example, correct, adjust or otherwise compensate for errors carried by signal 205 to provide a calibrated signal 205' having reduced and/or eliminated errors.

The term "calibration information" refers generally to any information indicative of a modification to one or more signals and/or electronic components. For example, calibration information may include a digital or analog signal having a value that is to be added or subtracted to a target signal. Calibration information may include a multiplication factor such as a gain to be applied to the signal. Alternatively, calibration information may include a code that carries information about how the target signal is to be adjusted or corrected, such as an index into a look up table (LUT).

Selection component 250 is adapted to adjust a range and/or a resolution of calibration information 215. For example, selection component 250 may be coupled to register 220 to receive bit values stored in the register. Selection component 250 may be configured to choose a bit weight for each bit position in register 220. For example, selection component 250 may include control signal 255 to select a desired range and/or resolution for calibration information 215.

Figure 3A:
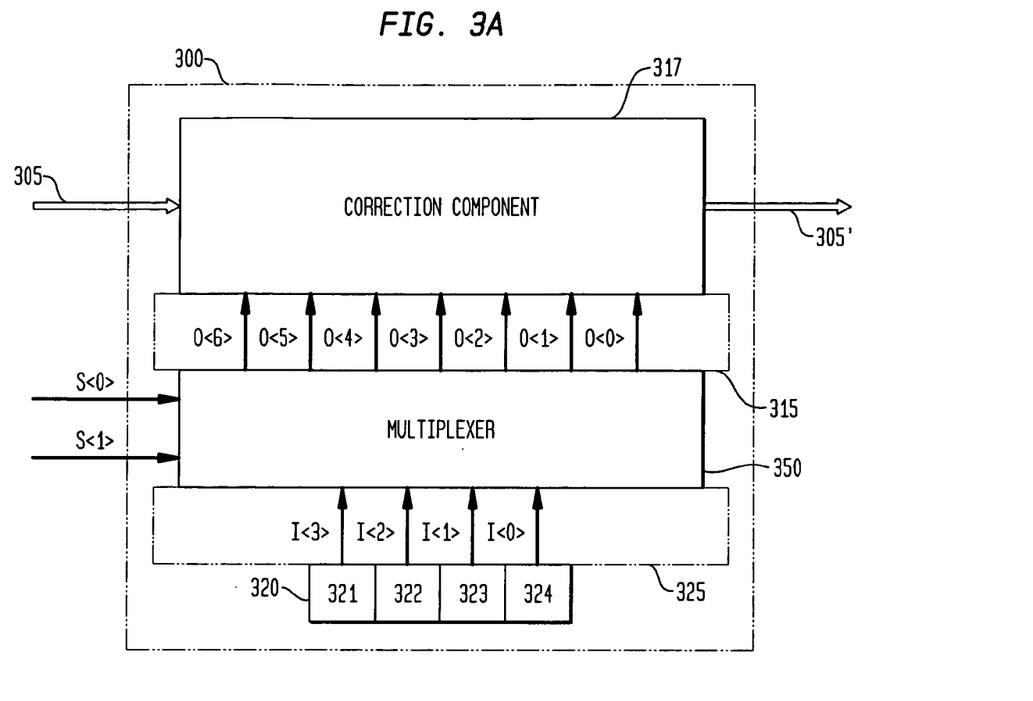
FIG. 3A illustrates one embodiment according to the present invention of a calibration component having a multiplexer as a selection component.

Control signal 255 may be any signal capable of indicating how the bit values received from register 220 should be weighted, that is, control signal 255 may select a bit weight configuration for register 220. In one embodiment, control signal 255 includes a plurality of select lines as described in more detail in connection with FIG. 3. Selection component 250 may be any component, circuitry, logic or combination thereof capable of selecting a bit weight configuration for register 220, where each bit weight configuration provides a corresponding range and resolution for calibration information 215.

Correction component 217 may be any component capable of adjusting input signal 205 according to calibration information 215. For example, when signal 205 is a digital signal, correction component 217 may be a summing element such as an adder that provides the sum of input signal 205 and calibration information 215. When signal 205 is an analog signal, correction component 217 may include, for example, a digital-to-analog converter (DAC) to convert calibration information 215 into an analog signal before applying the signal to calibrate signal 205. However, any logic, circuitry or device capable of applying calibration information to a signal may be suitable and is considered to be within the scope of the invention.

Selection component 250 allows the resolution of calibration information to be selected after a device or component has been manufactured. Accordingly, the range and resolution of the calibration component may be configured after the errors have been quantified, by setting control signal 255 to a value that selects a bit weight configuration capable of correcting an error at a desired range and resolution. Control signal 255 may be a set of binary states that can be stored in a memory by, for example, selectively blowing fuses or by storing the value in various other nonvolatile or volatile memory.

Figure 2B:
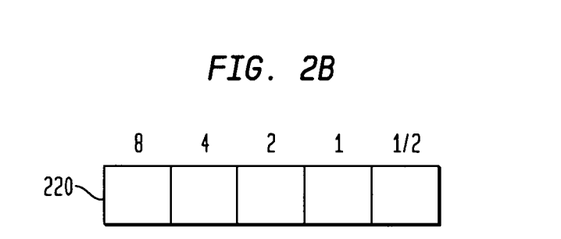
FIGS. 2B and 2C illustrate exemplary bits weights that may be assigned to the calibration bits of the register of the calibration component illustrated in FIG. 2A after manufacture.
Figure 2C:
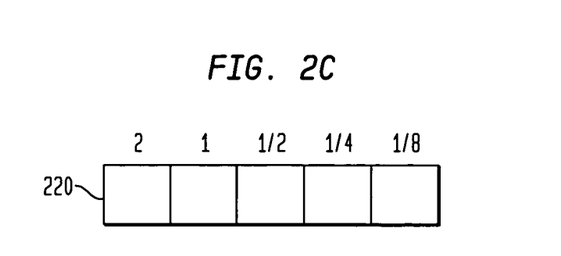

Calibration component 200 may be configured to tailor calibration information to actual errors measured post-production. For example, testing of a particular device after manufactured may indicate an error of 6.125 in signal 205. To compensate appropriately for this measured error, control signal 255 may be chosen to assign bit weights to register 220 as shown in FIG. 2B. Testing of another similar device after manufacture may indicate an error of 1.125 in signal 205. To compensate for this measured error, control signal 255 may be set such that selection component 250 assigns bit weights to register 220 as shown in FIG. 2C. While the devices exhibit very different error characteristics, both devices may be adequately corrected without having to add additional calibration bits to the device.

FIG. 3A illustrates one embodiment of a calibration component according to the present invention having a multiplexer selection component. Calibration component 300 includes correction component 317 that receives an input signal 305 and applies calibration information 315 provided as a seven bit word over connections O<6>–O<0> to form calibrated signal 305'. Multiplexer 350 is coupled to register 320 to receive a four bit word over connections I<3>–I<0> provided by register 320. Select lines S determine how values at connections I will be distributed to connections O.

Each of connections O may have a fixed bit weight due to its connection to correction component 317. For example, correction component 317 may be configured such that a binary value of 1 at connection O<6> carries a calibration weight of 4, a binary value of 1 at connection O<5> carries a calibration weight of 2, etc. Since multiplexer component 350 may be configured to selectively pass values appearing at connections I to desired connections O, multiplexer 350 determines the bit weight configuration of the calibration bits provided by register 320. Accordingly, calibration component 300 can be configured to provide calibration information at a plurality of ranges and resolutions.

Figure 3B:
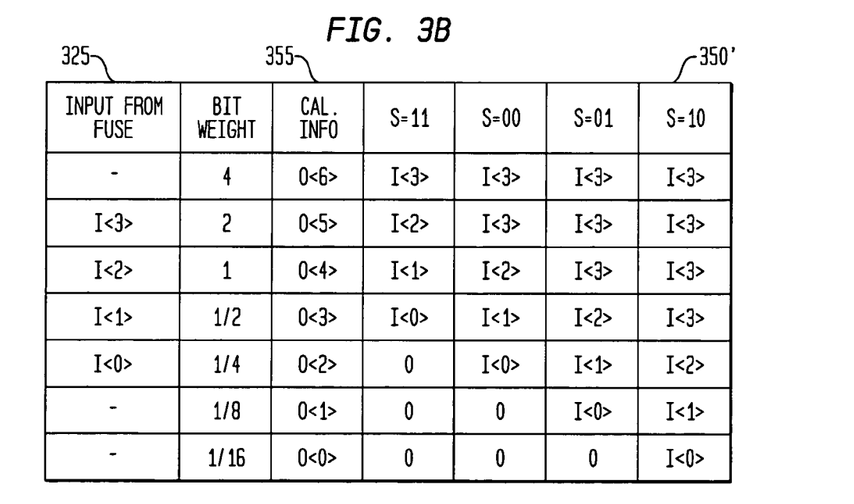
FIG. 3B illustrates one embodiment of bit weight configurations of the multiplexer selection component illustrated in FIG. 3A.

FIG. 3B illustrates one embodiment illustrating a plurality of bit weight configurations that can be selectively chosen by calibration component 300. As illustrated in the second column of table 350', correction component 317 interprets O<6> (i.e., the most significant bit) as carrying a bit weight of 4, connection O<5> as carrying a bit weight of 2, etc. Connection O<0> (i.e., the least significant bit) carries a bit weight of 1/16. In one embodiment, register 320 comprises four fuses that may be selectively blown such that each of connections I<3>–I<0> may be configured to carry a 0 (e.g., a blown fuse or open circuit condition) or a 1 (e.g., a connected fuse or short circuit condition). It should be appreciated that a blown fuse may indicate a 1 and a connected fuse may indicate a 0.

Select lines S may be configured to control which values stored by register 320 and appearing at connection I<3>–I<0> are passed to which of connections O<6>–O<0>. For example, when select lines S are both configured high (i.e., S<0>=1 and S<1>=1) as shown in the fourth column of table 350', multiplexer 350 passes the value at connection I<3> to connection O<6>. As a result, the value stored at position 321 of register 320 and provided at connection I<3> is assigned a bit weight of 4. Similarly, in select state 11, multiplexer 350 provides the value appearing at connection I<2> to connection O<5>, connection I<1> to connection O<4>, and connection I<0> to connection O<3>.

In this state and bit weight configuration, calibration component 300 selects the largest range and lowest resolution available. On the other hand, in select state 10 (i.e., S<0>=1 and S<1>=0), the value at I<3> is provided to O<3> and therefore accorded a bit weight of ½ and the value of I<0> is provided to O<0> for a bit weight of 1/16. In select state 10, calibration component 300 is configured with the smallest range and the highest resolution available. Select states 00 and 01 may select bit weight configurations having ranges and resolutions in between as shown in table 350'.

It should be appreciated that while the bit weights are shown as positive weights, in a two's complement representation, the most significant bit will indicate a negative weight. In a two's complement representation, an n-bit value will not change when expanded to an n+1 bit value if the expanded bit is the most significant bit and is given the same value as the next most significant bit.

As shown in table 350', the select states configure the multiplexer from high range/low resolution to low range/high resolution by providing multiple connections for the most significant bit in register 320. As the bit weight configurations transition from low resolution (s=11) to high resolution (s=10), the value at position 321 (i.e., the value provided over connection I<3>) is provided to an additional one of connections O. That is, the value at 321 provides a coefficient for more than one bit weight and the values at bit positions 322, 323 and 324 are successively shifted towards the less significant (high resolution) connections O.

It should be appreciated that one's complement representations may be used or any other suitable representation for providing calibration information. For example, calibration information 355 may represent a binary code that may be converted into a calibration value by correction logic 310 before being applied to input signal 305.

Calibration component 300 facilitates the selection of a resolution and range of calibration information 315 in a post-production stage, that is, after the device has been manufactured. Testing equipment may be employed that provides one or more known input signals to be operated on by the device. Since the values of the input signals are known, an ideal and error free device would generate signals having expected values that may be computed (e.g., signal 305 may have an expected value if the device were ideal. The testing equipment may then measure one or more signals provided or generated by the device in response to the known signals. Actual values of the measured signal may be compared to expected values to determine errors carried by one or more of device signals (i.e., testing may determine the extent to which the device operates differently from an ideal device).

A calibration value may then be determined that compensates or corrects for the error. Since calibration component 300 can be configured to provide calibration information at a number of different ranges and resolutions after the device has been manufactured, the determined calibration value can be stored and provided without problems of insufficient range or inadequate resolution that may occur in conventional calibration where range and resolution are fixed before manufacture. For example, select lines may be configured (e.g., by selectively blowing the appropriate fuses) to provide a bit weight configuration that provides calibration information at an optimal range and resolution to reduce or eliminate the measured error. This procedure may be repeated for any number of signals that may benefit from calibration.

Figure 4A:
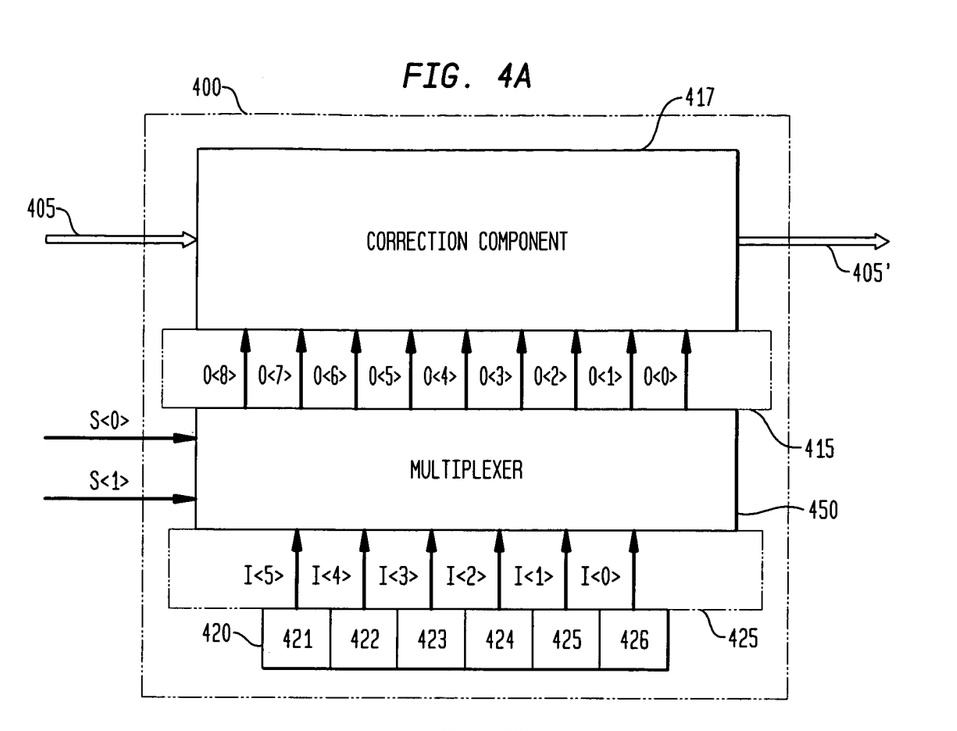
FIG. 4A illustrates another embodiment according to the present invention of a calibration component having a multiplexer as a selection component.
Figure 4B:
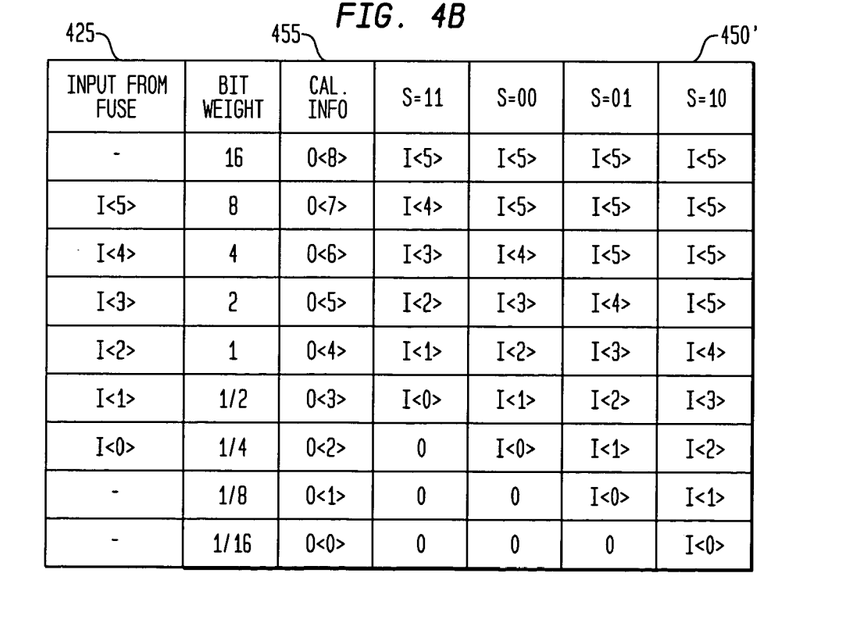
FIG. 4B illustrates another embodiment of bit weight configurations of the multiplexer selection component illustrated in FIG. 4A.

It should be appreciated that the invention is not limited to any number of calibration bits. For example, FIG. 4A illustrates a calibration component 400 having a 6 bit register 420 and 9 bits of calibration information 415. Table 450' in FIG. 4B illustrates one embodiment of how calibration component 400 may be configured to selectively provide a plurality of ranges and resolutions depending on the calibration needs of signal 405. In addition, any number of select lines may be provided to a multiplexer selection component having any number of bit weight configurations from which to choose.

Figure 5A:
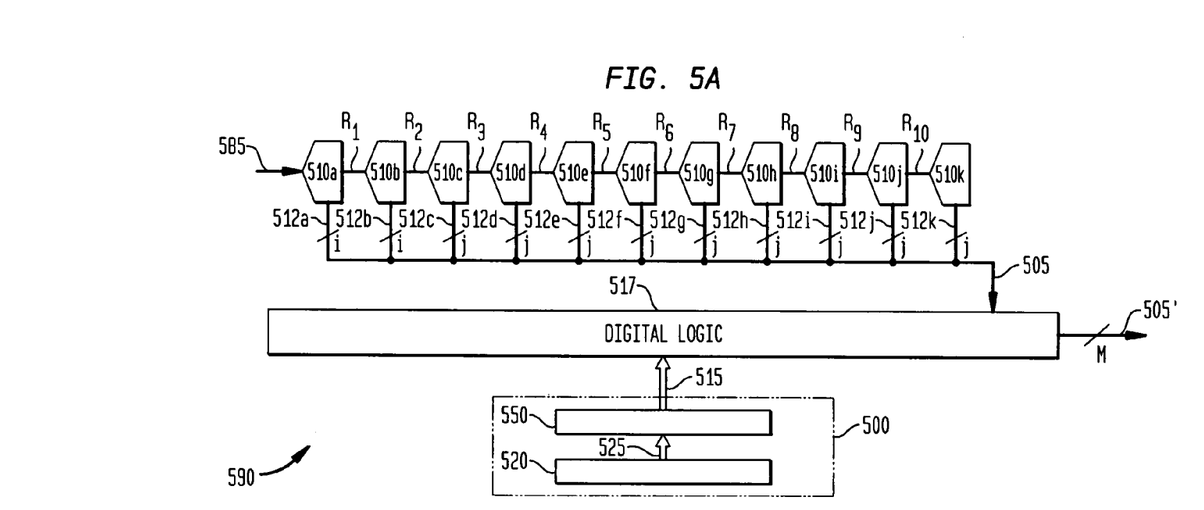
FIG. 5A illustrates one embodiment of an analog-to-digital converter (ADC) having a calibration component according to the present invention, the calibration component configured to calibrate one or more signals of the ADC with at least one variable resolution calibration coefficient.

FIG. 5A illustrates one embodiment of a calibration component according to the present invention employed to calibrate one or more signals of an analog-to-digital converter (ADC). ADC 590 may be a multi-stage pipeline converter comprising a plurality of stages 510a–510k. The first stage receives an analog signal 585, for example, an analog signal to be digitized.

Each stage in the pipeline may receive an analog input signal and provide a digital output signal and an analog output signal. The various digital output signals 512 provided by the stages of the pipeline together form M-bit digital signal 505. Digital signal 505 may then be provided to digital logic 517 for alignment and/or calibration to provide digital output word 505', which approximates input analog signal 585 to the resolution and precision of the ADC. That is, digital output word 505' is a digitized and calibrated representation of analog input signal 585.

Generally, the first stage (e.g., stage 510*a*) produces a number of the most significant bits (e.g., the i most significant bits) of digital signal 505. For example, digital output bits 512*a* provided by stage 510*a* may indicate uncalibrated coefficients for weights $2_{M-1}$, $2_{M-2}$ and $2_{M-3}$ of digital signal 505. Similarly, stage 510*b* may provide the next i most significant bits, stage 510*c* may provide the next j most significant bits, etc. In one embodiment, stages 510*a* and 510*b* may be 3-bit converter stages and stages 510*c*–510*k* may be 2-bit converter stages.

In some embodiments, the pipeline may include stages having one or more overlap bits to compensate for gain errors in the pipeline. For example, stages 510*a* and 510*b* may be so-called 3.5 bit stages and stages 510*c*–510*k* may be so-called 1.5 bit stages. However, the number of stages in the pipeline and the arrangement and number of bits provided by each stage is not limited to any number and/or configuration, and may depend on the desired speed, accuracy or precision of the ADC.

Figure 5B:
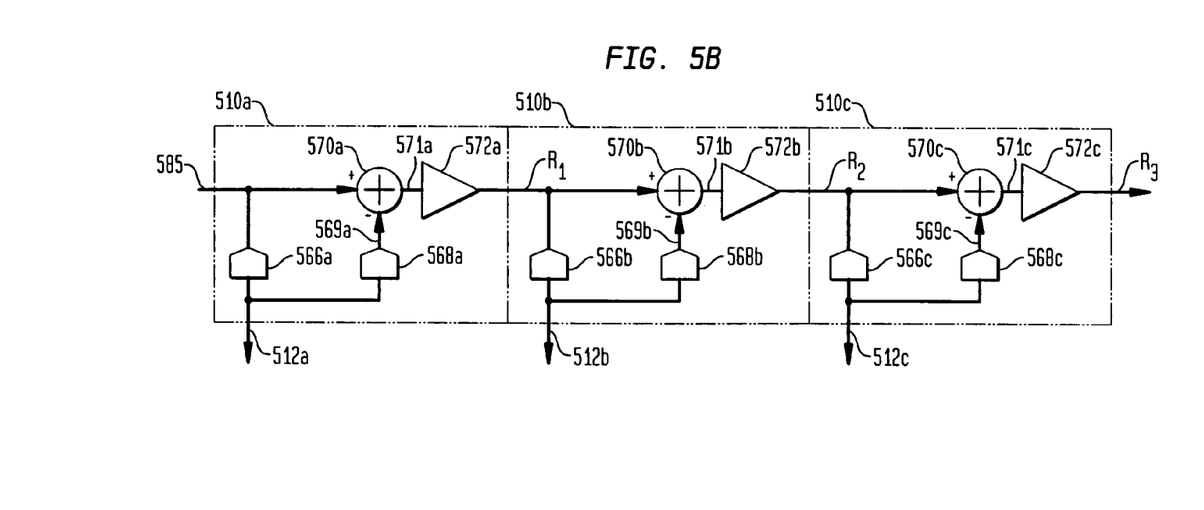
FIG. 5B illustrates an expanded view of several of the stages in the pipeline of the multi-stage ADC illustrated in FIG. 5A.

Each stage also provides an analog signal $R_1$–$R_{10}$, referred to as the residue signal, to the subsequent stage of the pipeline. The residue represents the difference between the analog input signal and the digital output signal. The residue signal provided by a given stage is A/D converted by the subsequent stage to produce the next most significant bits of digital signal 505. FIG. 5B illustrates exemplary components comprising stages 510*a*, 510*b* and 510*c* of ADC 590. Stage 510*a* receives the analog signal to be converted to a digital signal by the pipeline. Analog signal 585 may be provided to an i-bit analog-to-digital converter 566*a* to provide digital output bits 512*a*. ADC 566*a* may be, for example, a flash converter such as a 3-bit MDAC. The digital output bits 512*a* are both provided to digital logic 517 as shown in FIG. 5A, and to a digital-to-analog converter (DAC) 568*a* to convert the signal back to analog form.

Digital output bits 512*a* will likely represent a value different then the value of analog signal 585, due in part to quantization errors of converter 566*a*. Accordingly, analog signal 569*a* will be indicative of the quantization errors of the stage. This error may be indicated by forming a difference between the input analog signal 585 and analog signal 569*a*, for example, by providing the signals to summing element 570*a*. The difference signal 571*a* may then be amplified, for example, by amplifier 572*a* to provide residue signal $R_1$.

The difference signal 571*a* may be amplified such that the residue signal has a desired range. For example, amplifier 572*a* may have a gain of 2, or any other gain that achieves a desired range for the subsequent stage. Residue $R_1$ may then be provided as the analog input signal to be operated on by the successive stage. As shown in stages 510*b* and 510*c*, this operation may be repeated at each stage in the pipeline, wherein each successive stage provides a number of the next most significant bits of the digital signal 505, and generates a residue to be operated on by the next stage in the pipeline. In this way, each stage refines the digital output and increases the resolution of the digital signal 505.

However, the digital outputs of the various stages in a pipeline may carry errors other than quantization errors. For example, the ADCs in each of the respective stages may include capacitor mismatch errors (e.g., from capacitors within sample and hold elements of converters 566.) Accordingly, it may be desirable to calibrate the digital outputs provided by at least some of the stages in order to compensate for component mismatch or other errors that may be determined, for example, when the device is tested after manufacture. Accordingly, calibration 500 may be included to provide any number of calibration bits to adjust the digital outputs 512 such that digital output word 505' is calibrated with respect to those errors.

For example, calibration 500 may include register 520 and selection component 550. Register 520 may include a plurality of calibration bits configured to calibrate at least one of digital output bits 512 provided by the various stages of the pipeline. Selection component 550 may be adapted to assign bit weights to each of the calibration bits stored in register 520, such that the resolution of calibration information 515 provided to calibrate one or more signals of the ADC may be selectively chosen after the ADC has been manufactured and the actual errors present in the device have been determined.

The accuracy and precision of a pipeline ADC may be effected by offset errors, gain errors, integral non-linearity (INL) error, and differential non-linearity (DNL) error, thermal noise, etc. For example, offset errors typically relate to a uniform DC offset of the transfer function of the ADC. Gain errors relate to non-ideal digital code characteristics, INL errors indicate the extent that the ADC transfer function deviates from linear and DNL errors indicate adjacent output irregularities. These errors and others may be corrected for by providing appropriate calibration. According to various aspects of the present invention, the resolution and range of calibration can be selected after the device has been measured and actual values of specific errors have been measured.

Figure 6:
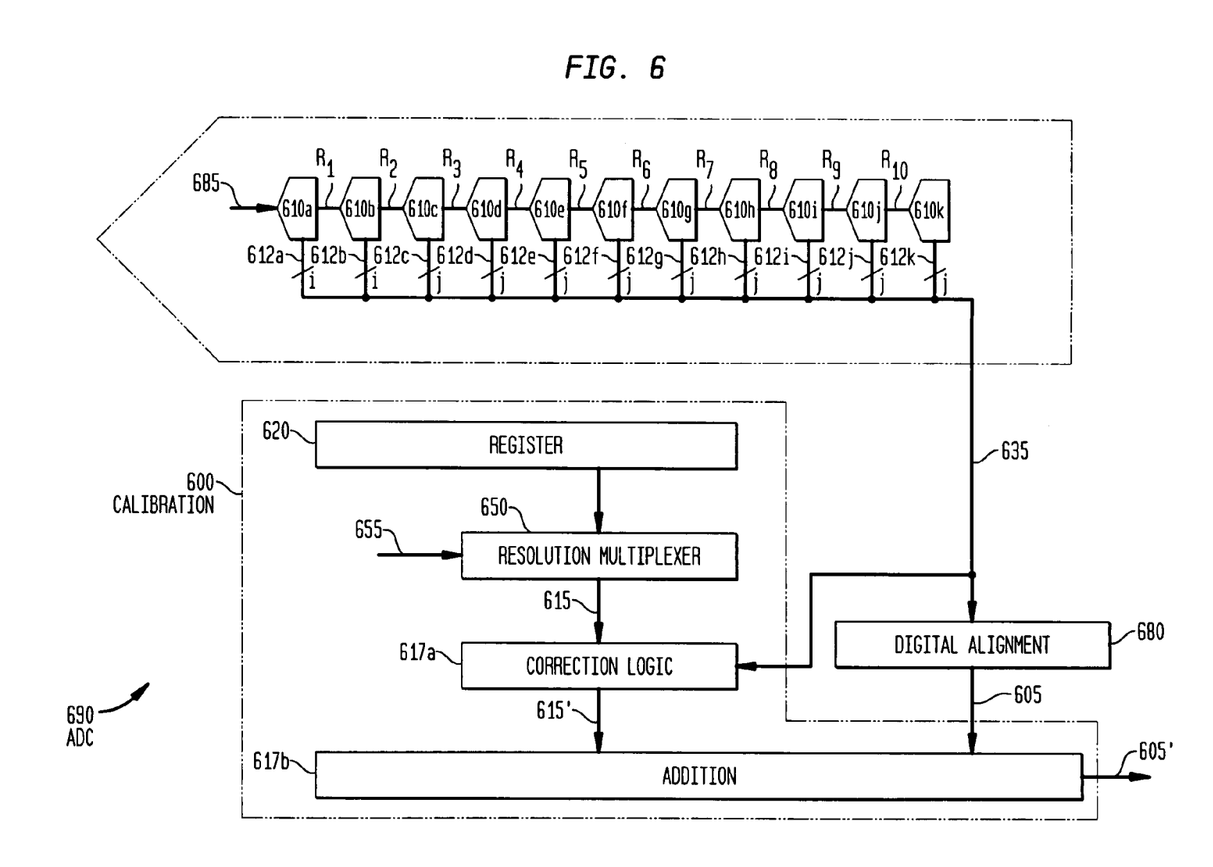
FIG. 6 illustrates another embodiment of a multi-stage ADC with a calibration component having a resolution multiplexer as a selection component according to the present invention.

FIG. 6 illustrates one embodiment according to the present invention of a calibration component for calibrating a pipeline ADC 690. ADC 690 may be similar to ADC 590 illustrated in FIG. 5A. For example, ADC 690 may include an n-stage pipeline that produces (after alignment) an M-bit digital word 605 indicative of the value of a sample of input analog signal 685. ADC 690 may include a calibration component 600 having a register 620, resolution multiplexer 650, correction logic 617*a*, and addition block 617*b*. Register 620 may include any number of bits and/or may include a plurality of registers configured to calibrate one or more stages of the pipeline.

Figure 7A:
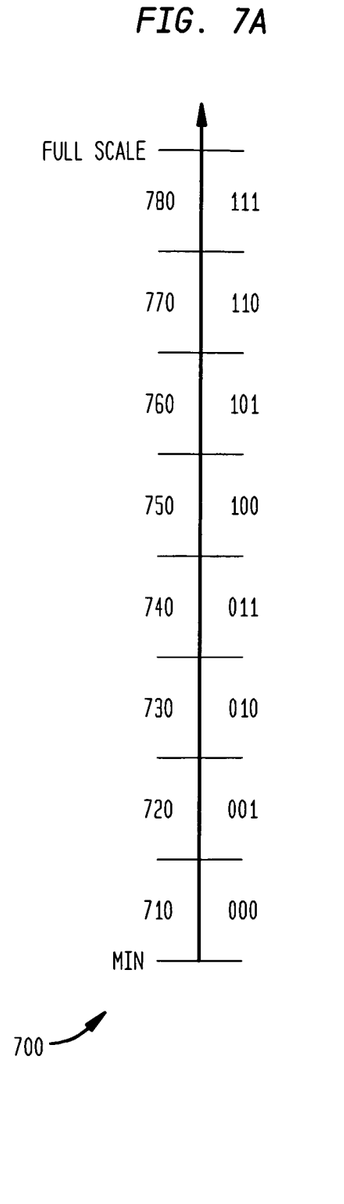
FIG. 7 illustrates an exemplary range of one of the stages of the multi-stage pipeline of the ADC illustrated in FIG. 6.
Figure 7B:
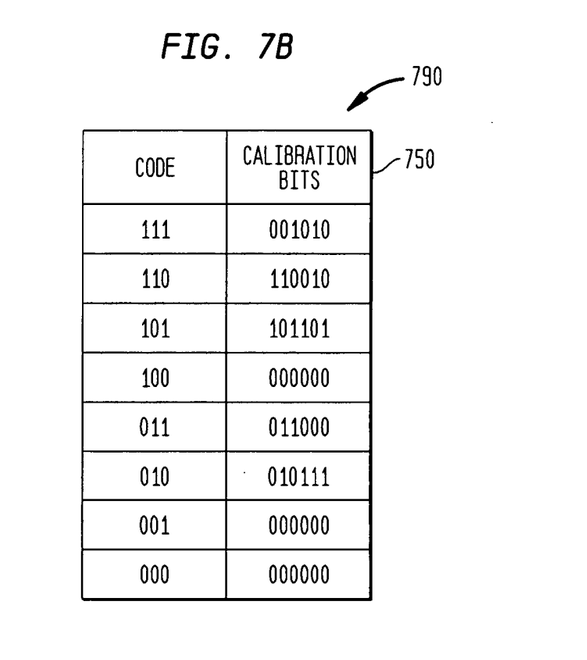

Each stage in the pipeline may be subdivided into a plurality of subranges, each subrange having an associated value. This value is often referred to as a digital code, or simply a code. When the value or level of the analog input signal to a stage (e.g., the value of the analog signal at the time when the analog signal is sampled) falls within a particular subrange, the associated code is provided as the digital output signal for the respective stage (e.g., provided as digital output bits 612). FIGS. 7A and 7B illustrate exemplary codes for subranges of one stage (e.g., stage 610*a*) of a pipeline and associated calibration bits for each subrange, respectively.

FIG. 7A illustrates a range 700 defining the minimum and maximum values of an analog input signal to be digitized. For example, range 700 may range from 0 to full scale (e.g., from a zero voltage to a maximum peak-to-peak value of a reference voltage signal), may range from a negative to a positive maximum, or any suitable range that describes values of an analog input signal. Range 700 may include a plurality of subranges 710–780. When an input analog signal is sampled, its value is compared with the subranges (e.g., via a flash converter) and the digital code associated with the appropriate subrange may be output as, for example, digital output bits 612a, 612b, etc. For example, if the value of a given sample of the input analog signal falls within subrange 760, the stage outputs a digital code of 101. Accordingly, in exemplary range 700, an analog input signal is quantized into 1 of 8 possible codes.

FIG. 7B illustrates a table 790 listing an association between digital codes for each of the subranges and an indication of how the subrange is to be calibrated. For example, each subrange may have associated with it a plurality of calibration bits, also referred to herein as a calibration coefficients. In the embodiment illustrated in FIG. 7B, each subrange is assigned a six bit calibration coefficient. The value of the coefficient may be determined, for example, during post-production testing of the ADC. Accordingly, register 620 in FIG. 6 may include 48 bits for calibrating stage 610a of pipeline 690. It should be appreciated that the arrangement illustrated in FIGS. 7A and 7B are merely exemplary. The range of a stage may be divided into any number of subranges and the digital codes may include any number of bits. In some embodiments, one or more stages may share overlap bits with a successive stage. In addition, calibration coefficients may be of any length or one or more subranges may not have an associated calibration coefficient.

In reference to FIG. 6, register 620 may include all of the calibration bits to calibrate the digital signal 605 provided by the pipeline. For example, register 620 may include calibration coefficients for each of the one or more subranges of the stages that are being calibrated. All of the stages need not be calibrated. For example, the first stage typically produces the largest errors, particularly at or near subrange boundaries, and the subsequent stages typically produce respectively smaller errors. Accordingly, a particular implementation may choose to calibrate only the first stage, the first several stages, or all of the stages in the pipeline, depending on the requirements of the ADC.

As shown in FIGS. 7A and 7B, the width of the digital code provided by a stage and the width of the calibration coefficient may be different. However, it should be appreciated that each bit in the digital code provided by a stage has an associated bit weight. For example, the digital code provided by stage 610a typically represents the three most significant bits of digital data 635. As discussed above, if digital data 635 has a width of 14 bits, stage one may produce bit 14, 13 and 12 of digital data 635 having associated bit weights of, for example, $2^{13}$, $2^{12}$ and $2^{11}$ LSB, respectively. Similarly, an n-bit calibration coefficient has n associated bit weights. For example, the calibration coefficients in FIG. 7 will have 6 bit weights that may be, according to various aspects of the present invention, chosen once an error in the associated stage has been determined and the range/resolution requirements of the error correction have been quantified.

Some or none of the bit weights of a digital code may overlap with bit weights of an associated calibration coefficient. For example, some of the 6-bit calibration coefficients illustrated in FIG. 7B may be assigned bit weights $2^5$–$2^0$ LSB. Accordingly, the digital code and the associated calibration coefficient may be of a different resolution altogether. In conventional systems, the resolution of the calibration coefficients were chosen at design time and fixed at the time the device was manufactured. That is, in conventional systems, the value of each bit (i.e., a zero or a one) of the calibration coefficient could be chosen after production (e.g., by selectively blowing fuses), but the weight assigned to each bit could not. As discussed above, the inability to precisely predict component errors before a part is manufactured often forced designers to make choices about range and resolution that proved to be insufficient or wasteful once the device was manufactured and the actual errors measured.

In the embodiment of FIG. 6, the range and resolution of calibration coefficients (i.e., the bit weights assigned to each of the calibration bits) may be determined after a device has been manufactured, for example, after component mismatch errors of a particular device have been determined. Accordingly, devices may be individually calibrated to compensate for varying component mismatch errors that may result on a component-by-component, part-by-part, and/or device-by-device basis, by configuring resolution multiplexer 650 appropriately. Resolution multiplexer 650 may be configured to select one of a plurality of bit weight configurations to provide calibration of a desired resolution to one or more signals of ADC 690. For example, control signal 655 may be configured such that resolution multiplexer assigns desired bit weights to calibration bits stored in register 620 as illustrated in table 350' or 450'. It should be appreciated that resolution multiplexer 650 may include a plurality of multiplexers, each of the plurality of multiplexers adapted to control the bit weights assigned to one or more calibration coefficients.

Correction logic 617a may be coupled to receive calibration information 615 from resolution multiplexer 650 and apply it to uncalibrated digital signal 605 to form calibrated digital output word 605'. Correction logic 617a may be responsible for selecting and arranging calibration information from resolution multiplexer 650 so that the appropriate calibration can be applied to the uncalibrated signal 605.

It should be appreciated that digital data 635, in addition to being uncalibrated, may be misaligned in time. Due to the pipeline architecture, the first stage will provide digital output bits 612a corresponding to a first sample of analog input signal 685 at time to. Since stage 610b operates on the residue $R_1$ provided by stage 610a, it will not provide digital output bits 612b corresponding to the first sample until time $t_1$ (each increment in time t may be, for example, a clock cycle, a half clock cycle or any number of clock cycles suitable for sampling the analog input signal and advancing the pipeline). Simultaneously at time $t_1$, stage 610a provides digital output bits 612a corresponding to a second sample of analog input signal 685. Accordingly, at some arbitrary time after the pipeline has filled (e.g., at time $t_n$, where n is the number of stages and times thereafter), digital data 635 is comprised of a plurality of digital output bits 612 from n different samples of analog input signal 685.

Digital alignment 680 may be included to align the data such that digital signal 605 includes digital output bits 612 provided by the various stages corresponding to the same sample. Digital alignment may include a plurality of delay blocks, for example, a delay block for each stage in the pipeline. Each of the delay blocks may be configured to have a delay that depends on the position of the corresponding stage in the pipeline.

In one embodiment, digital alignment includes a plurality of registers and timing circuitry that store digital bits 612 and selectively provide the bits according to timing signals to provide aligned (and uncalibrated) digital signal 605. Digital signal 605 may then be provided to calibration component 600 to be adjusted according to the calibration bits stored in register 620 and the bit weights assigned by resolution multiplexer 650. That is, uncalibrated digital signal 605 is adjusted according to calibration information 615 to provide calibrated digital output word 605'. In one embodiment, correction logic 617a selects and arranges calibration information 615 and provides calibration information 615' to be added to uncalibrated digital signal 605 by addition block 617*b*. The calibration information typically indicates a magnitude of an error to be corrected and when applied to signal 605 provides a calibrated and digitized output word 605'.

Figure 8:
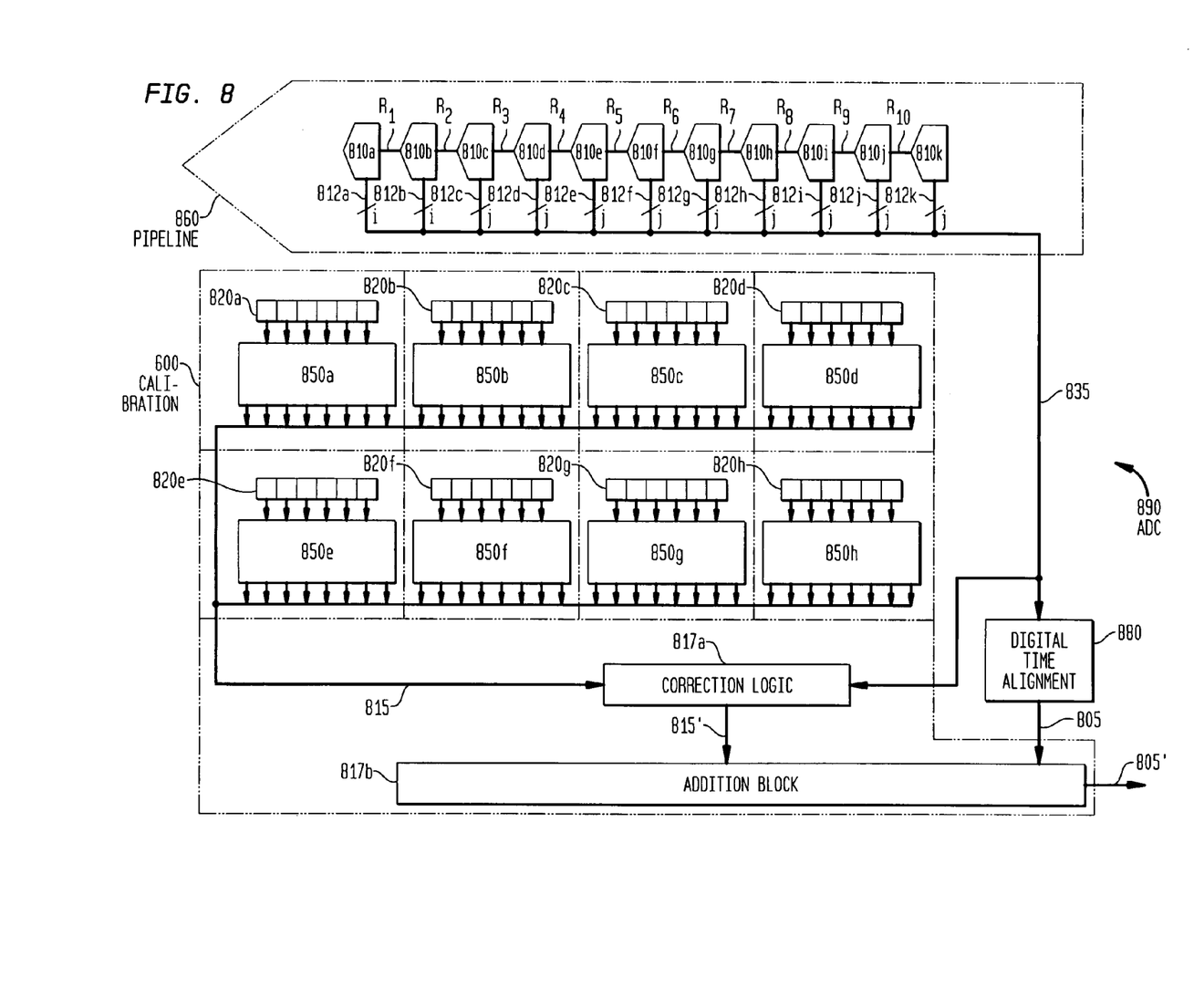
FIG. 8 illustrates another embodiment of a multi-stage ADC with a calibration component having a resolution multiplexer as a selection component according to the present invention.

FIG. 8 illustrates another embodiment according to the present invention of a calibration component 800 for calibrating the first stage 810*a* in a multi-stage pipeline of an ADC 890. ADC 890 may be similar to ADC 690 described in connection with FIG. 6. For example, stage 810*a* may be subdivided into a plurality of subranges. In one embodiment, stage 810*a* includes 8 subranges, each subrange having an associated 3-bit code.

Calibration 800 is adapted to calibrate the digital output bits provided at least from stage 810*a* and may include a plurality of registers 820*a*–820*h*, each of the registers storing calibration bits for a respective subrange of stage 810*a*. Register 820*a* may store calibration bits for the first subrange, for example, subrange 710 illustrated in FIG. 7A. Register 820*b* may store calibration bits for the second subrange (e.g., subrange 720), etc. Each register may be coupled to a respective selection component 850 (e.g., a resolution multiplexer) adapted to assign bit weights to each bit in the associated register by selectively connecting the bits of the register to one or more of the outputs of the selection component.

The plurality of selection components 850*a*–850*h* provide calibration information 815 to correction logic 817*a*. As described in connection with FIG. 6, at each time increment, stage 810*a* will produce digital output bits 812*a* corresponding to a successive sample of analog input signal 885. The output bits appear as a portion of digital data 835 (e.g., the first three most significant bits of 835). Correction logic 817*a* may also receive digital data 835 and, based on the value of the portion associated with stage 810*a*, select the calibration information provided by the corresponding selection component. The selected calibration information may be formatted or provided directly to addition block 817*b* to calibrate digital output word 805.

For example, at some time t, analog input signal 885 may be sampled. At the same time, stages 810*b*–810*k* operate on analog input signals corresponding to samples taken at time t-1, t-2, t-3, etc., respectively. Accordingly, correction logic 817*a* receives the bits of digital data 835 corresponding to the digital code provided at 812*a*, and uses this code to select the calibration information provided by the corresponding selection component 250.

For example, the 3-bit digital code provided at 812*a* may indicate that the value of the sample at time t was in the third subrange of stage 810*a*. Accordingly, correction logic 817*a* may select calibration information provided by selection component 850*c* to use in the calibration of digital output word 805. Correction logic 817*a* may also pad or otherwise align the selected calibration information so that it can be appropriately added to uncalibrated digital output word 805. Accordingly, digital alignment 880 and correction logic 817*a* arrange and assemble the data to be calibrated and the calibration information such that addition block 817*b* can appropriately apply the calibration information to signal 805 to provide calibrated signal 805'.

It should be appreciated that any number of the stages may be calibrated in the manner described in connection with stage 810*a*. For example, calibration 800 may include a bank of registers and selection components for additional stages for which calibration is desired. When multiple stages are calibrated, correction logic 817*a* may be adapted to store and sort calibration information received from the various selection components to account for misalignment that results from the pipeline architecture.

In some embodiments selection components 850 may be shared by more than one register. For example, calibration bits corresponding to more than one subrange may be provided to a single selection component to assign bit weights to calibration coefficients. Furthermore, correction logic 817*a* may be provided upstream from the selection components. For example, correction logic 817*a* may receive digital data 835 and depending on the digital codes included in the signal, may select or enable only certain outputs from the plurality of selection components. There are numerous other variations that will occur to one skilled in the art. However, any component or arrangement of components capable of selecting and arranging the appropriate calibration information so that it can be used to adjust one or more signals is considered to be within the scope of the present invention.

Accordingly, various aspects of the present invention provide calibration that can be configured to have one of a number of ranges and resolutions after a device has been measured and the actual errors in the device have been measured. It should be appreciated that various aspects of the present invention may be may be used alone, in combination, or in a variety of arrangements not specifically discussed in the embodiments described in the foregoing and is therefore not limited in its application to the details and arrangement of components set forth in the foregoing description or illustrated in the drawings.

The invention is capable of other embodiments and of being practiced or of being carried out in various ways. In particular, various aspects of the present invention may be practiced with any number of electronic devices to calibrate for any number of different errors that may arise in those device implementations and arrangements.

In addition, various aspects of the invention described in one embodiment may be used in combination with other embodiments and is not limited by the arrangements and combinations of features specifically described herein. Various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A method of calibrating at least one signal of an electronic device, the method comprising acts of:
   providing a plurality of calibration bits arranged such that each of the plurality of calibration bits is capable of being assigned a bit weight selected from a respective plurality of possible bit weights;
   selectively assigning a selected bit weight to at least one of the plurality of calibration bits, the selected bit weight chosen to provide calibration information having a selected resolution and/or range; and
   applying the calibration information to the at least one signal to provide at least one calibrated signal.

2. The method of claim 1, wherein the act of selectively assigning the selected bit weight includes an act of selectively assigning a selected bit weight to each of the plurality of calibration bits, respectively.

3. The method of claim 2, wherein the act of selectively assigning the selected bit weights includes an act of selectively assigning one of a plurality of bit weight configurations to the plurality of calibration bits.

4. The method of claim 1, wherein the act of providing a plurality of calibration bits includes an act of storing at least one value in a memory.

5. The method of claim 4, wherein the act of providing a plurality of calibration bits includes an act of selectively blowing a plurality of fuses, each fuse providing a respective one of the plurality of calibration bits.

6. The method of claim 3, wherein the act of selectively assigning the one of the plurality of bit weight configurations includes an act of providing a control signal having a plurality of states, each state corresponding to one of the plurality of bit weight configurations capable of being assigned to the plurality of calibration bits.

7. The method of claim 3, wherein the electronic device is an analog to digital converter (ADC) adapted to convert an analog signal to a digital signal, and wherein the at least one signal is the digital signal provided by the ADC, the method further comprising acts of:
providing, as the analog signal, at least one input signal with a known value to the ADC;
measuring actual values of the at least one signal in response to the at least one input signal; and
comparing the actual values to expected values of the at least one signal to determine at least one calibration value indicative of an error of the ADC.

8. The method of claim 7, wherein the act of selectively assigning one of a plurality of bit weight configurations includes an act of selectively assigning a bit weight configuration from the plurality of bit weight configurations that provides a range and/or resolution that best compensates for the at least one calibration value.

9. A apparatus for calibrating at least one signal of an electronic device, the apparatus comprising:
at least one register capable of storing a plurality of bits;
a selection component coupled to the at least one register and receiving at least one control signal, the selection component configured to assign one of a plurality of bit weights to at least one of the plurality of bits of the at least one register to provide calibration information at a selected resolution and/or range indicated by the at least one control signal; and
a correction component coupled to the selection component to receive the calibration information, the correction component adapted to adjust the at least one signal based on the calibration information to provide at least one calibrated signal.

10. The apparatus of claim 9, wherein the at least one selection component is configured to assign one of a plurality of bit weight configurations to the plurality of bits of the at least one register.

11. The apparatus of claim 10, wherein the selection component includes a multiplexer having a plurality of inputs to receive the plurality of bits and a plurality of outputs, each of the plurality of outputs having an associated bit weight, the multiplexer configured to pass values at the plurality of inputs to the plurality of outputs according to the at least one control signal.

12. The apparatus of claim 11, wherein the plurality of outputs are coupled to the correction component.

13. The apparatus of claim 10, wherein the control signal includes a plurality of select bits having a plurality of states, each of the plurality of states corresponding to one of the plurality of bit weight configurations.

14. The apparatus of claim 10, wherein each of the plurality of inputs may be connected to more than one of the plurality of outputs by the multiplexer.

15. The apparatus of claim 9, wherein the correction component includes a summing element that provides at least one of a sum or a difference between the at least one signal and the calibration information.

16. The apparatus of claim 9, wherein the electronic device includes an analog-to-digital converter (ADC) comprising:
at least one stage to receive an analog signal and provide a digital signal indicative of the analog signal.

17. The apparatus of claim 16, wherein the at least one signal includes the digital signal.

18. The apparatus of claim 17, wherein for each sample of the analog signal the digital signal indicates one of a plurality of digital codes, each of the plurality of digital codes associated with one of a plurality of subranges such that the digital code provided by the at least one stage indicates a quantized value of the sample of the analog signal.

19. The apparatus of claim 18, wherein some of the plurality of bits of the at least one register calibrate at least one digital code of the at least one stage.

20. The apparatus of claim 19, wherein the at least one register includes a plurality of registers, each of the plurality of the registers configured to calibrate one of the plurality of digital codes.

21. The apparatus of claim 16, wherein the at least one stage includes a plurality of stages, each of the plurality of stages receiving an analog input signal and providing a digital output signal that indicates one of a plurality of digital indicating to which subrange a sample of the analog input signal belongs and wherein the at least one register includes at least one register to calibrate at least one digital code provided by each of the plurality of stages.

22. An apparatus for calibrating at least one signal of an electronic device, the apparatus comprising:
at least one register capable of storing a plurality of calibration coefficients, each of the plurality of calibration coefficients capable of being assigned a bit weight selected from a respective plurality of possible bit weights, the calibration coefficients indicating calibration information for the at least one signal;
means for selectively assigning a selected bit weight to at least one of the plurality of calibration coefficients to select a range and/or a resolution of the calibration information after the electronic device has been manufactured;
and a correction component arranged to receive the calibration information and apply the calibration information to the at least one signal.

23. The apparatus of claim 22, wherein the means for selectively assigning the selected bit weight includes means for assigning one of a plurality of bit weight configurations to the at least one register after the device has been manufactured to set the resolution of the calibration information.

24. The apparatus of claim 23, wherein the means for selectively assigning one of the plurality of bit weight configurations includes a multiplexer having a plurality of inputs to receive the plurality of bits and a plurality of outputs, each of the plurality of outputs having an associated bit weight, the multiplexer configured to pass values at the plurality of inputs to the plurality of outputs according to the at least one control signal.

25. The apparatus of claim 24, wherein the plurality of outputs are coupled to the correction component.

26. The apparatus of claim 24, wherein the multiplexer includes a plurality of select bits having a plurality of states, each of the plurality of states corresponding to one of a plurality of bit weight configurations capable of being applied to the plurality of calibration coefficients.

27. The apparatus of claim 24, wherein each of the plurality of inputs may be connected to more than one of the plurality of outputs by the multiplexer.

28. The apparatus of claim 22, wherein the correction component includes a summing element that provides at least one of a sum or a difference between the at least one signal and the calibration information.

29. The apparatus of claim 22, wherein the electronic device includes an analog-to-digital converter (ADC) comprising:
    at least one stage to receive an analog signal and provide a digital signal indicative of the analog signal.

30. The apparatus of claim 29, wherein the at least one signal includes the digital signal.

31. The apparatus of claim 30, wherein for each sample of the analog signal the digital signal indicates one of a plurality of digital codes, each of the plurality of digital codes associated with one of a plurality of subranges such that the digital code provided by the at least one stage indicates a quantized value of the sample of the analog signal.

32. The apparatus of claim 31, wherein some of the plurality of bits of the at least one register calibrate at least one digital code of the at least one stage.

33. The apparatus of claim 32, wherein the at least one register includes a plurality of registers, each of the plurality of the registers configured to calibrate one of the plurality of digital codes.

34. The apparatus of claim 29, wherein the at least one stage includes a plurality of stages, each of the plurality of stages receiving an analog input signal and providing a digital output signal that indicates one of a plurality of digital codes indicating to which sub-range a sample of the analog input signal belongs and wherein the at least one register includes at least one register to calibrate at least one digital code provided by each of the plurality of stages.

* * * * *

UNITED STATES PATENT AND TRADEMARK OFFICE
CERTIFICATE OF CORRECTION

PATENT NO. : 6,975,950 B2 Page 1 of 1
DATED : December 13, 2005
INVENTOR(S) : Scott G. Bardsley It is certified that error appears in the above-identified patent and that said Letters Patent is hereby corrected as shown below:

Column 12,
Line 35, replace "to" with -- $t_0$ --.

Signed and Sealed this

Fourteenth Day of March, 2006

JON W. DUDAS
*Director of the United States Patent and Trademark Office*